US012681048B2

(12) United States Patent
Niu et al.

(10) Patent No.: US 12,681,048 B2
(45) Date of Patent: Jul. 14, 2026

(54) METHOD AND SYSTEM FOR TESTING HIGH-VOLTAGE RIDE-THROUGH OF PHOTOVOLTAIC INVERTER

(71) Applicants: Huaneng Power International Jiangsu Energy Development Co., Ltd., Nanjing (CN); Huaneng Rudong Baxianjiao Offshore Wind Power Generation Co., Ltd., Nanjing (CN)

(72) Inventors: Chenhui Niu, Nanjing (CN); Qingwei Cao, Nanjing (CN); Zhongyuan Yao, Nanjing (CN); Fang Bian, Nanjing (CN); Xiaolu Chen, Nanjing (CN); Yu Zhang, Nanjing (CN)

( * ) Notice: Subject to any disclaimer, the term of this patent is extended or adjusted under 35 U.S.C. 154(b) by 118 days.

(21) Appl. No.: 18/799,911

(22) Filed: Aug. 9, 2024

(65) Prior Publication Data

US 2024/0402220 A1     Dec. 5, 2024

Related U.S. Application Data

(63) Continuation of application No. PCT/CN2022/108361, filed on Jul. 27, 2022.

(30) Foreign Application Priority Data

Jun. 2, 2022     (CN) .......................... 202210624842.9

(51) Int. Cl.
 *G01R 15/14* (2006.01)
 *H02S 50/10* (2014.01)
(52) U.S. Cl.
 CPC ............ *G01R 15/144* (2013.01); *H02S 50/10* (2014.12)

(58) Field of Classification Search
 CPC ...... G01R 15/144; G01R 31/42; G01R 31/16; G01R 31/00; H02S 50/10
 See application file for complete search history.

(56) References Cited

U.S. PATENT DOCUMENTS

| | | | | |
|---|---|---|---|---|
| 2008/0207011 A1* | 8/2008 | Goosens | ................ | H01R 29/00 |
| | | | | 439/74 |
| 2013/0241585 A1* | 9/2013 | Inzunza Figueroa | .. | G01R 31/42 |
| | | | | 324/750.01 |

(Continued)

FOREIGN PATENT DOCUMENTS

| | | | | | |
|---|---|---|---|---|---|
| CN | 203287500 | * | 11/2013 | ............. | G01R 31/34 |
| CN | 203287500 U | | 11/2013 | | |

(Continued)

*Primary Examiner* — Alvaro E Fortich

(57) ABSTRACT

Disclosed are a method and system for testing high-voltage ride-through of a photovoltaic inverter. The method for testing high-voltage ride-through of a photovoltaic inverter includes: connecting a board-to-board (BTB) circuit to a passive circuit in series, and connecting circuit breakers to the passive circuit to form an inverter test device; connecting one end of the inverter test device to an alternating current power supply, and connecting the other end of the inverter test device to a tested apparatus; and performing testing by adjusting a parameter of the passive circuit and a switching mode of the circuit breakers by means of the BTB circuit. According to the present disclosure, an influence of the device for testing high-voltage ride-through of a photovoltaic inverter on power supply voltage is eliminated, a requirement on supply of reactive power of the power supply is eliminated, applicability is better, and cost is lower.

10 Claims, 3 Drawing Sheets

(56)         References Cited

U.S. PATENT DOCUMENTS

2018/0054070 A1 *    2/2018  Krishnamoorthy ..... H02J 7/865
2022/0354014 A1 *   11/2022  Feurtado ............. H05K 7/1432

FOREIGN PATENT DOCUMENTS

CN          103454521  A    12/2013
CN          105203890  A    12/2015
CN          105471389  A     4/2016
CN          106443268  A     2/2017
CN          108375730  A     8/2018
CN          111464042  A     7/2020

* cited by examiner

METHOD AND SYSTEM FOR TESTING HIGH-VOLTAGE RIDE-THROUGH OF PHOTOVOLTAIC INVERTER

CROSS-REFERENCE TO RELATED APPLICATIONS

The present application claims priority to Chinese Patent Application No. 2022106248429, filed Jun. 2, 2022, the entire disclosure of which is incorporated herein by reference.

TECHNICAL FIELD

The present disclosure relates to the technical field of photovoltaic inverter fault ride-through testing, in particular to a method and system for testing high-voltage ride-through of a photovoltaic inverter.

BACKGROUND

As photovoltaic power accounts for an increasing proportion in the energy field, the influence of photovoltaic power systems on power grids can no longer be ignored. The power system in China has a complex structure, with some regions carrying extra-high voltage direct current transmission systems. Many types of faults of a direct current system can contribute to the generation of transient high voltage. If a large-scale photovoltaic power station has no high-voltage ride-through capability, it will lead to widespread off-grid of the photovoltaic power station, which may result in the collapse of grid voltage and frequency, seriously affecting the safe and stable operation of the power grid.

Currently popular test devices tend to simulate transient overvoltage through three different approaches. As for a test device that uses a transformer tap for switching, a short current interruption occurs during switching, which may cause a tested apparatus to stop operating due to the current interruption. A test device using an inverter cannot simulate a real impedance parameter of a system in case of a power grid fault. The test devices with the above two topology structures are rarely used anymore.

A high-voltage ride-through test device, using an inductor-capacitor-resistor series connection, emits a large amount of reactive power during a test, so it is suitable for on-site testing of a photovoltaic power station. However, if the test device is used in a laboratory environment with a low voltage level and a small short-circuit capacity, the large amount of inductive reactive power output from the test device will likely have a significant impact on supply voltage.

SUMMARY

An objective of this section is to summarize some aspects of examples of the present disclosure and briefly introduce some preferred examples. Simplifications or omissions may be made in this section, as well as in the abstract and the invention title of the present disclosure, to avoid obscuring the purpose of this section, the abstract and the invention title, and such simplifications or omissions should not be used to limit the scope of the present disclosure.

In view of the above problems existing in the prior art, the present disclosure is provided.

In order to solve the technical problems, the present disclosure provides the following technical solutions, including: connecting a board-to-board (BTB) circuit to a passive circuit in series, and connecting circuit breakers to the passive circuit to form an inverter test device; connecting one end of the inverter test device to an alternating current power supply, and connecting the other end of the inverter test device to a tested apparatus; and performing testing by adjusting a parameter of the passive circuit and a switching mode of the circuit breakers by means of the BTB circuit.

As a preferred solution of a method for testing high-voltage ride-through of a photovoltaic inverter in the present disclosure, the passive circuit includes a current limiting reactor, a short-circuit capacitor and a resistor with a fixed parameter; and overshooting at voltage recovery is suppressed by means of the resistor with a fixed parameter.

As a preferred solution of the method for testing high-voltage ride-through of a photovoltaic inverter in the present disclosure, the BTB circuit uses a topology structure of alternating current-direct current-alternating current, one side of the BTB circuit is connected to the passive circuit, and the other side of the BTB circuit is connected to the alternating current power supply; and the side connected to the passive circuit uses a constant voltage control strategy, and the side connected to the alternating current power supply uses a constant power factor control strategy.

As a preferred solution of the method for testing high-voltage ride-through of a photovoltaic inverter in the present disclosure, the circuit breakers include a bypass-circuit breaker $S_1$ and a short-circuit breaker $S_2$; before a test, the bypass-circuit breaker $S_1$ remains closed, and the short-circuit breaker $S_2$ remains open; at the beginning of the test, the bypass-circuit breaker $S_1$ is opened, the current limiting reactor that is connected to the BTB circuit in series is put into operation, and the short-circuit breaker $S_2$ is closed to simulate transient high voltage generated by a fault of a power grid; and the short-circuit breaker $S_2$ is opened, the bypass-circuit breaker $S_1$ is closed after an interval of time T, and the test ends.

As a preferred solution of the method for testing high-voltage ride-through of a photovoltaic inverter in the present disclosure, the adjusting a parameter of the passive circuit includes: a high voltage amplitude K satisfies the following equation:

$$K = \frac{\sqrt{R^2 + \left(\frac{1}{\omega C}\right)^2}}{\sqrt{R^2 + \left(\omega L - \frac{1}{\omega C}\right)^2}}$$

where R is a resistance value of the resistor with a fixed parameter, C is a capacitance value of the short-circuit capacitor, L is an inductance value of the current limiting reactor, and ω is an angular velocity.

As a preferred solution of the method for testing high-voltage ride-through of a photovoltaic inverter in the present disclosure, the bypass-circuit breaker $S_1$ is connected to the current limiting reactor in parallel, and the short-circuit breaker $S_2$ is connected to the short-circuit capacitor in series.

As a preferred solution of the method for testing high-voltage ride-through of a photovoltaic inverter in the present disclosure, the BTB circuit runs in two ways of a voltage source and a current source.

As a preferred solution of a system for testing high-voltage ride-through of a photovoltaic inverter in the present disclosure, the system includes: a passive circuit configured to simulate transient high voltage; circuit breakers including a bypass-circuit breaker $S_1$ and a short-circuit breaker $S_2$ which are respectively configured to control whether inductance of an inverter test device is put into operation and simulate transient high voltage generated when a real fault occurs in a power grid; and a BTB circuit connected to the passive circuit in series and configured to adjust a parameter of the passive circuit and a switching mode of the circuit breakers, so as to eliminate an influence of the inverter test device on power supply voltage and implement testing.

As a preferred solution of the method for testing high-voltage ride-through of a photovoltaic inverter in the present disclosure, the inverter test device includes the passive circuit, the BTB circuit and the circuit breakers; one end of the inverter test device is connected to an alternating current power supply, and the other end of the inverter test device is connected to a tested apparatus; and the passive circuit includes a current limiting reactor, a short-circuit capacitor and a resistor with a fixed parameter, and overshooting at voltage recovery is suppressed by means of the resistor with a fixed parameter. The BTB circuit uses a topology structure of alternating current-direct current-alternating current, one side of the BTB circuit is connected to the passive circuit, and the other side of the BTB circuit is connected to the alternating current power supply; and the bypass-circuit breaker $S_1$ is connected to the current limiting reactor in parallel, and the short-circuit breaker $S_2$ is connected to the short-circuit capacitor in series.

As a preferred solution of the method for testing high-voltage ride-through of a photovoltaic inverter in the disclosure, the BTB circuit runs in two ways of a voltage source and a current source.

The present disclosure has the beneficial effects that an influence of the test device on power supply voltage is eliminated, and then the device can be used in a test laboratory with a small short-circuit capacity of a power supply or exact requirements on power supply voltage, such that an application range of the device is greatly increased. Moreover, automatic self-use of reactive power is implemented during testing, a requirement on supply of the reactive power of the power supply is eliminated, and electricity charge during testing is also greatly reduced.

BRIEF DESCRIPTION OF DRAWINGS

In order to explain the technical solutions in examples of the present disclosure more clearly, the accompanying drawings required in the description of the examples will be described below briefly. Apparently, the accompanying drawings in the following description show merely some examples of the present disclosure, and other drawings can be derived from these accompanying drawings by those of ordinary skill in the art without creative efforts. In the figures.

4

Figure 4:
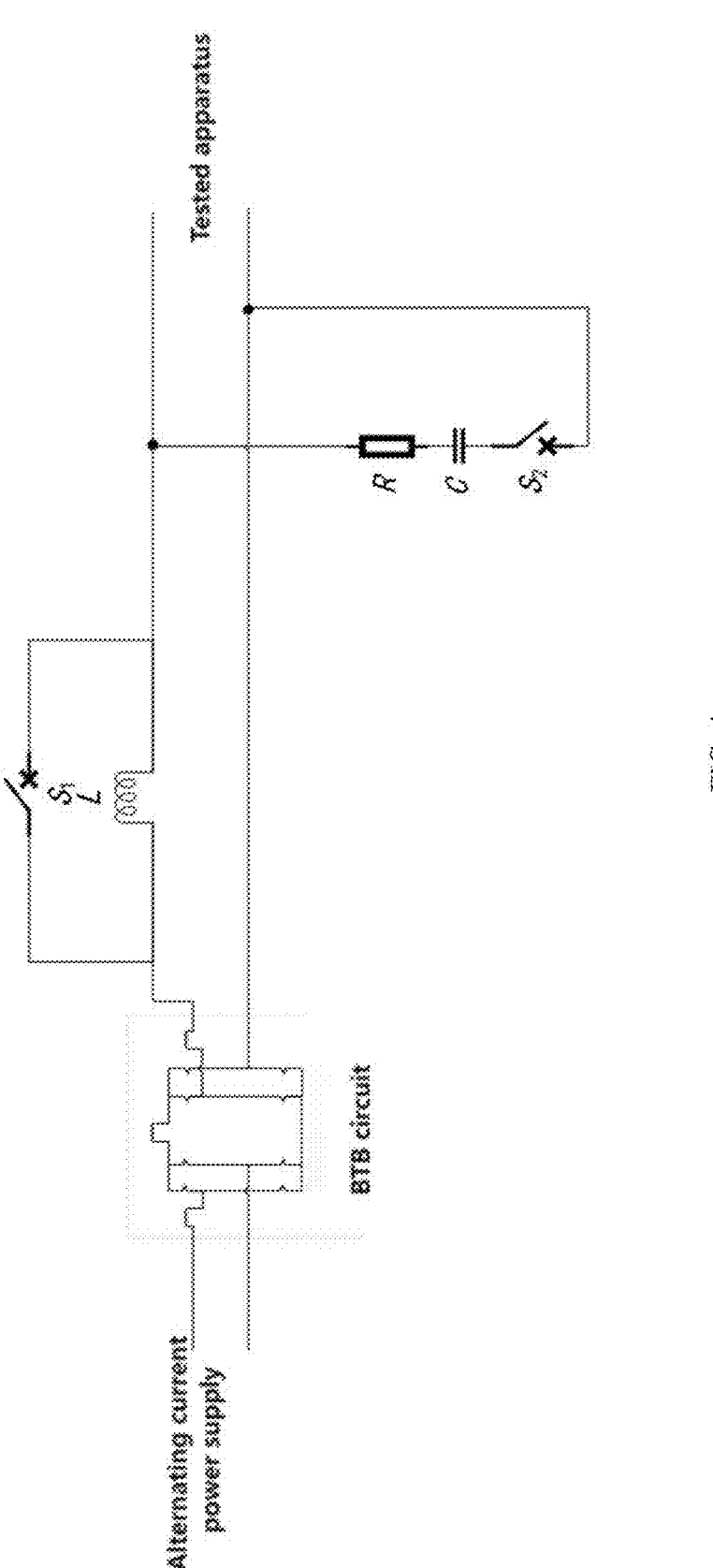

FIG. 4 is a schematic diagram of a topology structure of a current-source-type single-phase inverter test device of a method for testing high-voltage ride-through of a photovoltaic inverter according to Example 1 of the present disclosure.

DETAILED DESCRIPTION OF THE EMBODIMENTS

To make the foregoing objective, features, and advantages of the present disclosure clearer and more comprehensible, the specific embodiments of the present disclosure will be described in detail below in conjunction with the drawings of the specification. Apparently, the described examples are merely some examples rather than all examples of the present disclosure. Based on the examples of the present disclosure, all other examples acquired by those of ordinary skill in the art without making creative efforts fall within the scope of protection of the present disclosure.

In the following description, numerous concrete details are set forth in order to provide a thorough understanding of the present disclosure. However, the present disclosure may be implemented otherwise than as specifically described herein. Those skilled in the art can make similar developments without departing from the spirit of the present disclosure, and therefore the present disclosure is not to be limited by the specific examples disclosed below.

Second, reference herein to "an example" or "examples" means a particular feature, structure, or characteristic which may be included in at least one implementation of the present disclosure. The appearances of "in an example" in various places throughout this specification are not all referring to the same example, nor are separate or alternative examples mutually exclusive of other examples.

The present disclosure is described in detail in conjunction with schematic diagrams. When the examples of the present disclosure are described in detail, for the convenience of description, cutaway views representing device structures are not partially enlarged according to a general scale, and the schematic diagrams are merely instances, which should not limit the scope of protection of the present disclosure. Moreover, three-dimensional sizes of length, width and depth should be included in actual production.

In the description of the present disclosure, it should be noted that the terms "upper", "lower", "inner", "outer", etc. indicate azimuthal or positional relations based on those shown in the drawings only for ease of description of the present disclosure and for simplicity of description, and are not intended to indicate or imply that the referenced device or element must have a particular orientation and be constructed and operated in a particular orientation, and thus cannot be construed as a limitation on the present disclosure. Moreover, the terms "first", "second", "third", etc. are merely for descriptions and should not be understood as indication or implication of relative importance.

In the present disclosure, unless otherwise clearly specified, the terms "mount", "connect", etc. should be understood in a board sense. For example, connect may be a fixed connection, a detachable connection, an integral connection, a mechanical connection, an electrical connection, a direct connection, or an indirect connection by means of an intermediate medium, or may be intercommunication between two elements. Those of ordinary skill in the art may understand specific meanings of the foregoing terms in the present disclosure based on a specific situation.

Example 1

With reference to FIGS. 1-4, Example 1 is shown. The example provides a system for testing high-voltage ride-through of a photovoltaic inverter, including:

S1. Connect a board-to-board (BTB) circuit to a passive circuit in series, and connecting circuit breakers to the passive circuit to form an inverter test device.

Figure 1:
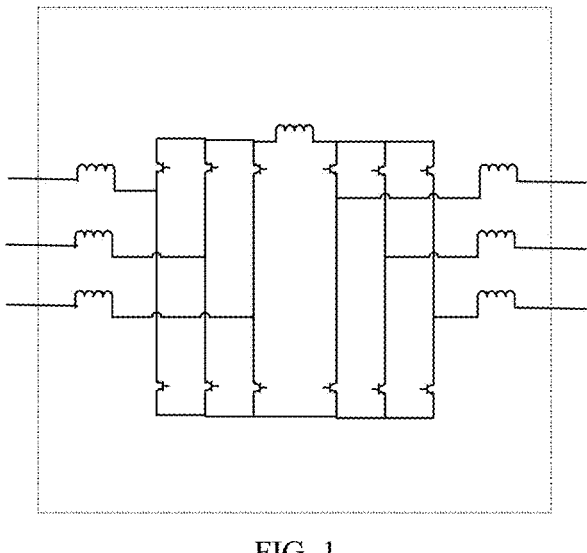
FIG. 1 is a schematic structural diagram of a current-source-type three-phase board-to-board (BTB) circuit of a method for testing high-voltage ride-through of a photovoltaic inverter according to Example 1 of the present disclosure.
Figure 2:
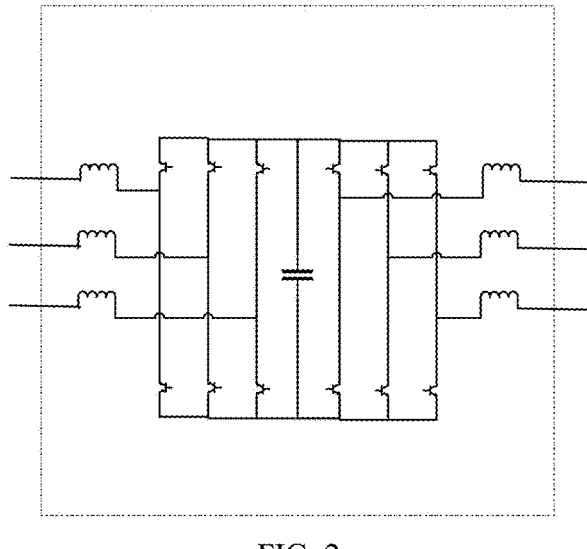
FIG. 2 is a schematic structural diagram of a voltage-source-type three-phase BTB circuit of a method for testing high-voltage ride-through of a photovoltaic inverter according to Example 1 of the present disclosure.

It should be noted that the BTB circuit uses a topology structure of alternating current-direct current-alternating current. One side of the BTB circuit is connected to the passive circuit, and the other side of the BTB circuit is connected to the alternating current power supply. The side connected to the passive circuit uses a constant voltage control strategy to guarantee that voltage on an alternating current side supplied to the passive circuit remains constant, and the side connected to the alternating current power supply uses a constant power factor control strategy, so as to eliminate an influence of the test device on a supply voltage level. With reference to FIGS. 1 and 2, the BTB circuit may run in two ways of a voltage source and a current source.

The passive circuit includes a current limiting reactor, a short-circuit capacitor and a resistor with a fixed parameter. An inductance value of inductance can be adjusted through series-parallel connection combination, multi-tap switching or other modes, such that the current limiting reactor can be obtained. A capacitance value of capacitance can be adjusted through series-parallel connection combination, multi-tap switching or other modes, such that the short-circuit capacitor can be obtained. Overshooting at voltage recovery can be suppressed by means of the resistor with a fixed parameter.

The circuit breakers include a bypass-circuit breaker $S_1$ and a short-circuit breaker $S_2$. The bypass-circuit breaker $S_1$ is connected to the current limiting reactor in parallel, and the short-circuit breaker $S_2$ is connected to the short-circuit capacitor in series.

Figure 3:
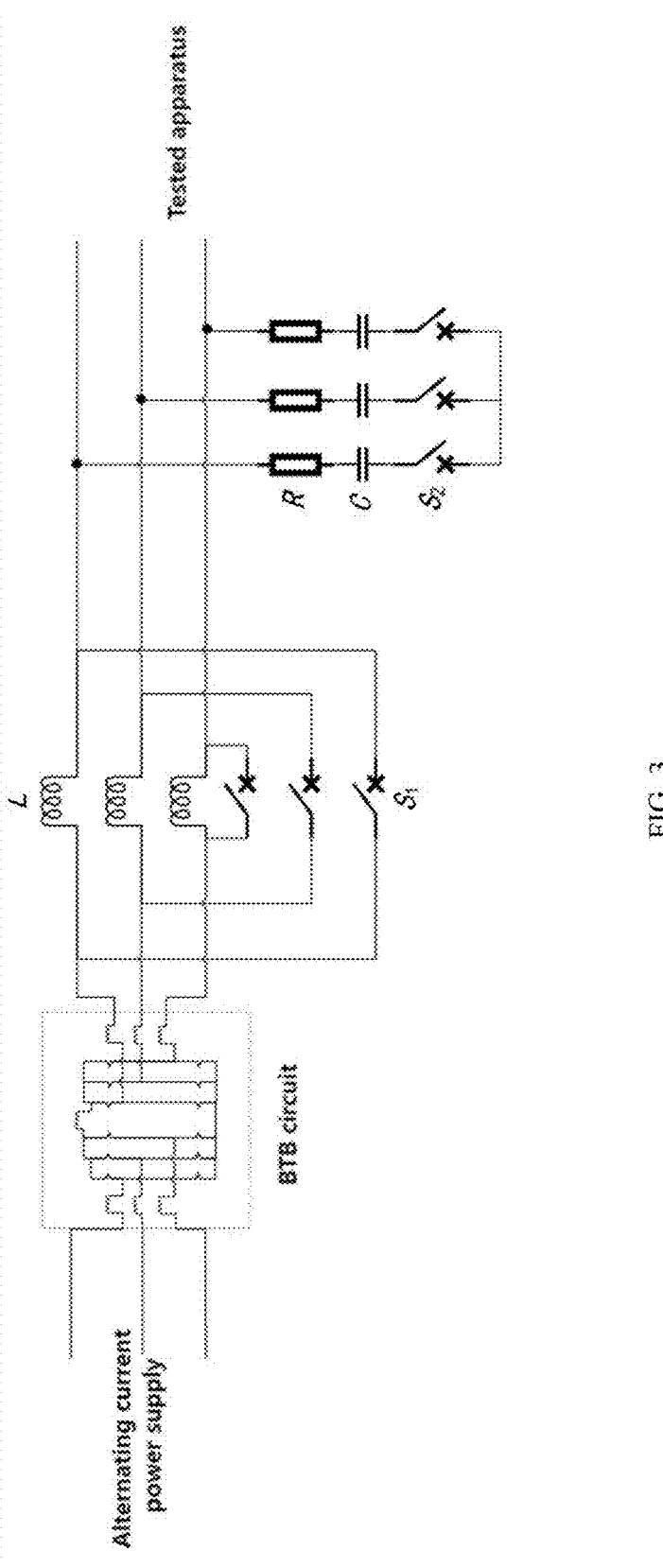
FIG. 3 is a schematic diagram of a topology structure of a current-source-type three-phase inverter test device of a method for testing high-voltage ride-through of a photovoltaic inverter according to Example 1 of the present disclosure.

With reference to FIGS. 3-4, schematic diagrams of topology structures of a three-phase inverter test device and a single-phase inverter test device are shown respectively.

S2. Connect one end of the inverter test device to an alternating current power supply, and connect the other end of the inverter test device to a tested apparatus.

The tested apparatus may be a photovoltaic inverter.

S3. Perform testing by adjusting a parameter of the passive circuit and a switching mode of the circuit breakers by means of the BTB circuit.

Before a test, the bypass-circuit breaker $S_1$ remains closed, and the short-circuit breaker $S_2$ remains open;

at the beginning of the test, the bypass-circuit breaker $S_1$ is opened, the current limiting reactor that is connected to the BTB circuit in series is put into operation, and the short-circuit breaker $S_2$ is closed to simulate transient high voltage generated by a fault of a power grid; and the short-circuit breaker $S_2$ is opened, the bypass-circuit breaker $S_1$ is closed after an interval of time T, and the test ends.

The adjusted parameter K, that is, a high voltage amplitude K, of the passive circuit satisfies the following equation:

$$K = \frac{\sqrt{R^2 + \left(\frac{1}{\omega C}\right)^2}}{\sqrt{R^2 + \left(\omega L - \frac{1}{\omega C}\right)^2}}$$

where R is a resistance value of the resistor with a fixed parameter in $\Omega$, C is a capacitance value of the short-circuit capacitor in F, L is an inductance value of the current limiting reactor in H, $\omega$ is an angular velocity, and $\omega = 2\pi f$ (f is 50 and 60 in Hz for power grids with different frequencies respectively).

Example 2

In order to verify and explain technical effects adopted in the method, in the example, a traditional test apparatus and the method are selected for a comparative test, and the test results are compared by scientific demonstration means to verify the true effect of the method.

In the example, a photovoltaic inverter of 1 MVW is tested using a test device with a capacity of 3 MVA. A correlation result is verified by the traditional test apparatus (without a BTB circuit) and a test circuit of the method separately.

Example: the traditional test apparatus is connected by means of a substation 110/10.5 kV substation, and a power supply is connected to an experimental system by means of a 4 MVA isolation transformer. Under the premise of knowing parameters of a main transformer and the isolation transformer of the substation, the following calculation can be performed:

Reactance Value of Main Transformer of Substation

Transformer parameters: 110/10.5 kV short-circuit impedance Uk=10.5%, and capacity of 31.5 MVA.

Reactance Value of Isolation Transformer

Transformer parameters: 10/10 kV short-circuit impedance Uk=8%, and capacity of 4 MVA.

During a test, a capacitor is fully put into operation and outputs reactive power of 3 MVA, and a voltage swell generated by 10.5 kV supply is:

$$\Delta U_1 = 10.5\% \times \frac{3MVA}{31.5MVA} = 1\%$$

A voltage swell generated by 10 kV supply in a laboratory is:

$$\Delta U_2 = \Delta U_1 + 8\% \times \frac{3MVA}{6MVA} = 5\%$$

In a case that a BTB circuit using the method consumes the reactive power output from the capacitor, a voltage swell effect can be significantly eliminated. A specific effect is shown in the table below.

TABLE 1

| | voltage swell elimination effect | | |
|---|---|---|---|
| Sequence number | Power consumed by BTB | $\Delta U_1$ | $\Delta U_2$ |
| 1 | 0 (not installed) | 1% | 5% |
| 2 | 1 MVA | 0.67% | 3.33% |
| 3 | 1.5 MVA | 0.5% | 2.5% |
| 4 | 2 MVA | 0.33% | 1.66% |
| 5 | 3 MVA (full offset) | 0% | 0% |

Therefore, the method can eliminate an influence of the test device on power supply voltage, and then the device can be used in a test laboratory with a small short-circuit capacity of a power supply or exact requirements on power supply voltage, such that an application range of the device is greatly increased.

Example: In each full set of tests: five points for high-voltage ride-through testing are provided. Each point needs to be repeatedly detected. There are seven types of testing (ABC phase, A phase, B phase, C phase, AB phase, BC phase, and CA phase). A total of 5*2*7=70 points need to be tested. Each point simulates a voltage fault for an average time of 5 s. Therefore, one full set of tests totally consumes:

$$3000 \ KVA * (70 * 5/3600) = 291 \ kWh$$

In a case that the method is used, when the reactive power is completely offset (there is about 1% active loss), one full set of tests totally consumes:

$$3000 \ kVA * 1\% * (70 * 5/3600) = 3 \ kWh$$

It can be seen that automatic self-use of reactive power is implemented during testing, a requirement on supply of the reactive power of the power supply is eliminated, and electricity charge during testing is also greatly reduced (the reactive power flowing through an electric energy meter requires additional charges, and the cost is higher than active power).

Example 3

Different from Example 1, the example provides a system for testing high-voltage ride-through of a photovoltaic inverter, including:

a passive circuit configured to simulate transient high voltage, where the passive circuit includes a current limiting reactor, a short-circuit capacitor and a resistor with a fixed parameter, and overshooting at voltage recovery is suppressed by means of the resistor with a fixed parameter;

circuit breakers including a bypass-circuit breaker $S_1$ and a short-circuit breaker $S_2$ which are respectively configured to control whether inductance of an inverter test device is put into operation and simulate transient high voltage generated when a real fault occurs in a power grid, where the bypass-circuit breaker $S_1$ is connected to the current limiting reactor in parallel, and the short-circuit breaker $S_2$ is connected to the short-circuit capacitor in series; and a BTB circuit connected to the passive circuit in series and configured to adjust a parameter of the passive circuit and a switching mode of the circuit breakers, so as to eliminate an influence of the inverter test device on power supply voltage and implement testing. The BTB circuit uses a topology structure of alternating current-direct current-alternating current, one side of the BTB circuit is connected to the passive circuit, and the other side of the BTB circuit is connected to the alternating current power supply. The BTB circuit runs in two ways of a voltage source and a current source.

The inverter test device includes the passive circuit, the BTB circuit and the circuit breakers. One end of the inverter test device is connected to an alternating current power supply, and the other end of the inverter test device is connected to a tested apparatus. The tested apparatus may be a photovoltaic inverter.

It should be appreciated that the examples of the present disclosure may be implemented or performed by computer hardware, a combination of hardware and software, or a computer instruction stored in a non-transitory computer-readable memory. The method may be implemented in a computer program by using standard programming techniques which includes a non-transitory computer-readable storage medium configured with a computer program. The storage medium so configured causes the computer to operate in a specific and predefined manner, that is, in accordance with the method and figures described in the specific examples. Each program may be implemented in a high-level procedural or object-oriented programming language to communicate with a computer system. However, if desired, the program may be implemented in an assembly or machine language. In any case, the language can be compiled or interpreted. Furthermore, the program can be run on a programmed application-specific integrated circuit for this purpose.

Furthermore, operations of the processes described herein may be executed in any suitable order, unless otherwise indicated herein or otherwise clearly contradicted by context. The processes (or variations and/or combinations thereof) described herein may be executed under control of one or more computer systems configured with executable instructions and may be implemented as codes (for example, executable instructions, one or more computer programs, or one or more applications) executed collectively on one or more processors, by hardware, or combinations thereof. The computer program includes a plurality of instructions executable by one or more processors.

Further, the method may be implemented in any type of suitable computing platforms that can be operatively connected, including but not limited to a personal computer, a minicomputer, a mainframe, a workstation, a networked or distributed computing environment, or a standalone or integrated computer platform, or implemented in communication with a charged particle tool or other imaging device, etc. Aspects of the present disclosure may be implemented as a machine-readable code stored on a non-transitory storage medium or apparatus, whether a removable or integrated computing platform, such as a hard disk, an optical read and/or write storage medium, a random access memory (RAM), a random access memory (ROM), etc., the machine-readable code is readable by a programmable computer. When read by the computer, the storage medium or apparatus may be used to configure and operate the computer to execute the processes described herein. Further, the machine-readable code, or portions thereof, may be transmitted over a wired or wireless network. When such media include instructions or programs that implement the steps described above in conjunction with a microprocessor or other data processors, the inventions described herein include these and other different types of non-transitory computer-readable storage media. The present disclosure also includes the computer itself when programming is performed according to the method and technique described herein. The computer program can be applied to input data to execute the functions described herein, so as to convert the input data to generate output data to be stored in a nonvolatile memory. Output information may also be applied to one or more output apparatuses such as a display. In a preferred example of the present disclosure, converted data represents physical and tangible objects, including specific visual depictions of physical and tangible objects produce on a display.

As used in the present disclosure, the terms "component", "module", "system", etc. are intended to refer to a computer-related entity. The computer-related entity may be hardware, firmware, a combination of hardware and software, software, or running software. For example, the component may be, but is not limited to, a process running on a processor, a processor, an object, an executable file, a thread in execution, a program, and/or a computer. As an instance, both an application running on a computing apparatus and the computing device can be components. One or more components can reside within a process and/or thread in execution. The components can be localized on one computer and/or distributed between two or more computers. Further, these components can be executed from various computer-readable media having various data structures. The components may communicate by way of local and/or remote processes according to, for example, a signal having one or more data packets (for example, data from one component that interacts with another component in a local system, distributed system, and/or interacts with other systems by way of a signal through a network such as the Internet).

It should be noted that the above-mentioned examples are merely intended for description of the technical solutions of the present disclosure rather than limitation of the present disclosure. Although the present disclosure is described in detail with reference to the preferred examples, those of ordinary skill in the art should understand that they may still make modifications or equivalent replacements to the technical solutions of the present disclosure without departing from the spirit and scope of the technical solutions of the present disclosure, all of which should be encompassed within the scope of the claims of the present disclosure.

What is claimed is:

1. A method for testing high-voltage ride-through of a photovoltaic inverter, comprising:

connecting a board-to-board (BTB) circuit to a passive circuit in series, and connecting circuit breakers to the passive circuit to form an inverter test device;

connecting one end of the inverter test device to an alternating current power supply, and connecting the other end of the inverter test device to a tested apparatus; and performing testing by adjusting a parameter of the passive circuit and a switching mode of the circuit breakers by means of the BTB circuit.

2. The method for testing high-voltage ride-through of a photovoltaic inverter according to claim 1, wherein the passive circuit comprises a current limiting reactor, a short-circuit capacitor and a resistor with a fixed parameter; and overshooting at voltage recovery is suppressed by means of the resistor with a fixed parameter.

3. The method for testing high-voltage ride-through of a photovoltaic inverter according to claim 1, wherein the BTB circuit uses a topology structure of alternating current-direct current-alternating current, one side of the BTB circuit is connected to the passive circuit, and the other side of the BTB circuit is connected to the alternating current power supply; and the side connected to the passive circuit uses a constant voltage control strategy, and the side connected to the alternating current power supply uses a constant power factor control strategy.

4. The method for testing high-voltage ride-through of a photovoltaic inverter according to claim 2, wherein the circuit breakers comprise a bypass-circuit breaker $S_1$ and a short-circuit breaker $S_2$;

before a test, the bypass-circuit breaker $S_1$ remains closed, and the short-circuit breaker $S_2$ remains open;

at the beginning of the test, the bypass-circuit breaker $S_1$ is opened, the current limiting reactor that is connected to the BTB circuit in series is put into operation, and the short-circuit breaker $S_2$ is closed to simulate transient high voltage generated by a fault of a power grid; and the short-circuit breaker $S_2$ is opened, the bypass-circuit breaker $S_1$ is closed after an interval of time T, and the test ends.

5. The method for testing high-voltage ride-through of a photovoltaic inverter according to claim 4, wherein the adjusting a parameter of the passive circuit comprises:

a high voltage amplitude K satisfies the following equation:

$$K = \frac{\sqrt{R^2 + \left(\frac{1}{\omega C}\right)^2}}{\sqrt{R^2 + \left(\omega L - \frac{1}{\omega C}\right)^2}}$$

wherein R is a resistance value of the resistor with a fixed parameter, C is a capacitance value of the short-circuit capacitor, L is an inductance value of the current limiting reactor, and ω is an angular velocity.

6. The method for testing high-voltage ride-through of a photovoltaic inverter according to claim 4, comprising:

the bypass-circuit breaker $S_1$ is connected to the current limiting reactor in parallel, and the short-circuit breaker $S_2$ is connected to the short-circuit capacitor in series.

7. The method for testing high-voltage ride-through of a photovoltaic inverter according to claim 6, wherein the BTB circuit runs in two ways of a voltage source and a current source.

8. A system for testing high-voltage ride-through of a photovoltaic inverter, comprising:

a passive circuit configured to simulate transient high voltage;

circuit breakers comprising a bypass-circuit breaker S1 and a short-circuit breaker S2 which are respectively configured to control whether inductance of an inverter test device is put into operation and simulate transient high voltage generated when a real fault occurs in a power grid; and a board-to-board (BTB) circuit connected to the passive circuit in series and configured to adjust a parameter of the passive circuit and a switching mode of the circuit breakers, so as to eliminate an influence of the inverter test device on power supply voltage and implement testing.

9. The system for testing high-voltage ride-through of a photovoltaic inverter according to claim 8, wherein the inverter test device comprises the passive circuit, the BTB circuit and the circuit breakers;

one end of the inverter test device is connected to an alternating current power supply, and the other end of the inverter test device is connected to a tested apparatus;

the passive circuit comprises a current limiting reactor, a short-circuit capacitor and a resistor with a fixed parameter, and overshooting at voltage recovery is suppressed by means of the resistor with a fixed parameter;

the BTB circuit uses a topology structure of alternating current-direct current-alternating current, one side of the BTB circuit is connected to the passive circuit, and the other side of the BTB circuit is connected to the alternating current power supply; and the bypass-circuit breaker $S_1$ is connected to the current limiting reactor in parallel, and the short-circuit breaker $S_2$ is connected to the short-circuit capacitor in series.

10. The system for testing high-voltage ride-through of a photovoltaic inverters according to claim 9, wherein the BTB circuit runs in two ways of a voltage source and a current source.

\* \* \* \* \*